(12) United States Patent
Bedeschi

(10) Patent No.: US 9,183,928 B2
(45) Date of Patent: Nov. 10, 2015

(54) DESCENDING SET VERIFY FOR PHASE CHANGE MEMORY

(75) Inventor: Ferdinando Bedeschi, Biassono (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 659 days.

(21) Appl. No.: 13/511,987

(22) PCT Filed: Dec. 29, 2009

(86) PCT No.: PCT/IT2009/000584
§ 371 (c)(1),
(2), (4) Date: Sep. 19, 2012

(87) PCT Pub. No.: WO2011/080770
PCT Pub. Date: Jul. 7, 2011

(65) Prior Publication Data
US 2013/0010533 A1    Jan. 10, 2013

(51) Int. Cl.
G11C 11/00     (2006.01)
G11C 13/00     (2006.01)

(52) U.S. Cl.
CPC ........ *G11C 13/0064* (2013.01); *G11C 13/0004* (2013.01); *G11C 13/0069* (2013.01); *G11C 2013/0078* (2013.01); *G11C 2013/0092* (2013.01)

(58) Field of Classification Search
CPC ........................................ G11C 11/00
USPC ............ 365/46, 94, 100, 113, 129, 148, 158, 365/163; 257/46, 94, 100, 113, 129, 148, 257/158, 163; 438/29, 95, 96, 166, 135, 438/240, 259, 365, 482, 486, 597, 785; 977/974

See application file for complete search history.

(56) References Cited

U.S. PATENT DOCUMENTS

| | | | |
|---|---|---|---|
| 2004/0151024 A1* | 8/2004 | Fricke et al. | 365/177 |
| 2004/0184331 A1* | 9/2004 | Hanzawa et al. | 365/203 |
| 2004/0202017 A1* | 10/2004 | Lee | 365/163 |
| 2005/0167656 A1* | 8/2005 | Sun et al. | 257/30 |
| 2005/0212037 A1* | 9/2005 | Pinnow et al. | 257/326 |
| 2006/0157683 A1* | 7/2006 | Scheuerlein | 257/4 |
| 2006/0256612 A1* | 11/2006 | Cho et al. | 365/163 |
| 2008/0123389 A1 | 5/2008 | Cho et al. | |

FOREIGN PATENT DOCUMENTS

| | | |
|---|---|---|
| WO | WO 2009-011221 | 1/2009 |
| WO | WO 2009-051274 | 4/2009 |

OTHER PUBLICATIONS

International Search Report mailed Jul. 27, 2010 in corresponding International Application No. PCT/IT2009/000584.
Written Opinion mailed * in corresponding International Application No. PCT/IT2009/000584.

* cited by examiner

*Primary Examiner* — Harry W Byrne
(74) *Attorney, Agent, or Firm* — Knobbe Martens Olson and Bear LLP

(57) ABSTRACT

Subject matter disclosed herein relates to a memory device, and more particularly to write performance of a phase change memory.

22 Claims, 7 Drawing Sheets

DESCENDING SET VERIFY FOR PHASE CHANGE MEMORY

RELATED APPLICATIONS

This application is a National Stage application of and claims the benefit of priority to PCT/IT2009/000584, filed Dec. 29, 2009, entitled "Descending Set Verify for Phase Change Memory", the contents of which is incorporated in its entirety by reference herein.

BACKGROUND

1. Field

Subject matter disclosed herein relates to a memory device, and more particularly to write performance of a phase change memory.

2. Information

Phase change memory (PCM) may operate based, at least in part, on behavior and properties of one or more particular phase change materials, such as chalcogenide alloy and/or germanium antimony telluride (GST), just to name a few examples. Crystalline and amorphous states of such materials may have different electrical resistivities, thus presenting a basis by which information may be stored. The amorphous, high resistance state may represent a stored first binary state and the crystalline, low resistance state may represent a stored second binary state. Of course, such a binary representation of stored information is merely an example: Phase change memory may also be used to store multiple memory states, represented by varying degrees of phase change material resistivity, for example.

A PCM memory cell may transition from an amorphous state to a crystalline state by applying a bias signal to the memory cell. Characteristics of a bias signal, such as peak magnitude and/or pulse width, for example, may be selected to allow a transition to a crystalline state. An improper selection of bias signal characteristics may result in a failure to transition to a crystalline state. Accordingly, such an improper selection may result in a PCM memory cell comprising a mixture of material in an amorphous and a crystalline state, which may lead to an undefined memory cell state resulting in a failure of the PCM memory cell, for example, or in decreased reliability (e.g., higher drift, lower data retention, and/or reduced endurance). On the other hand, a proper selection of bias signal characteristics may be relatively difficult to determine because biasing conditions for individual memory cells in a PCM may vary.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
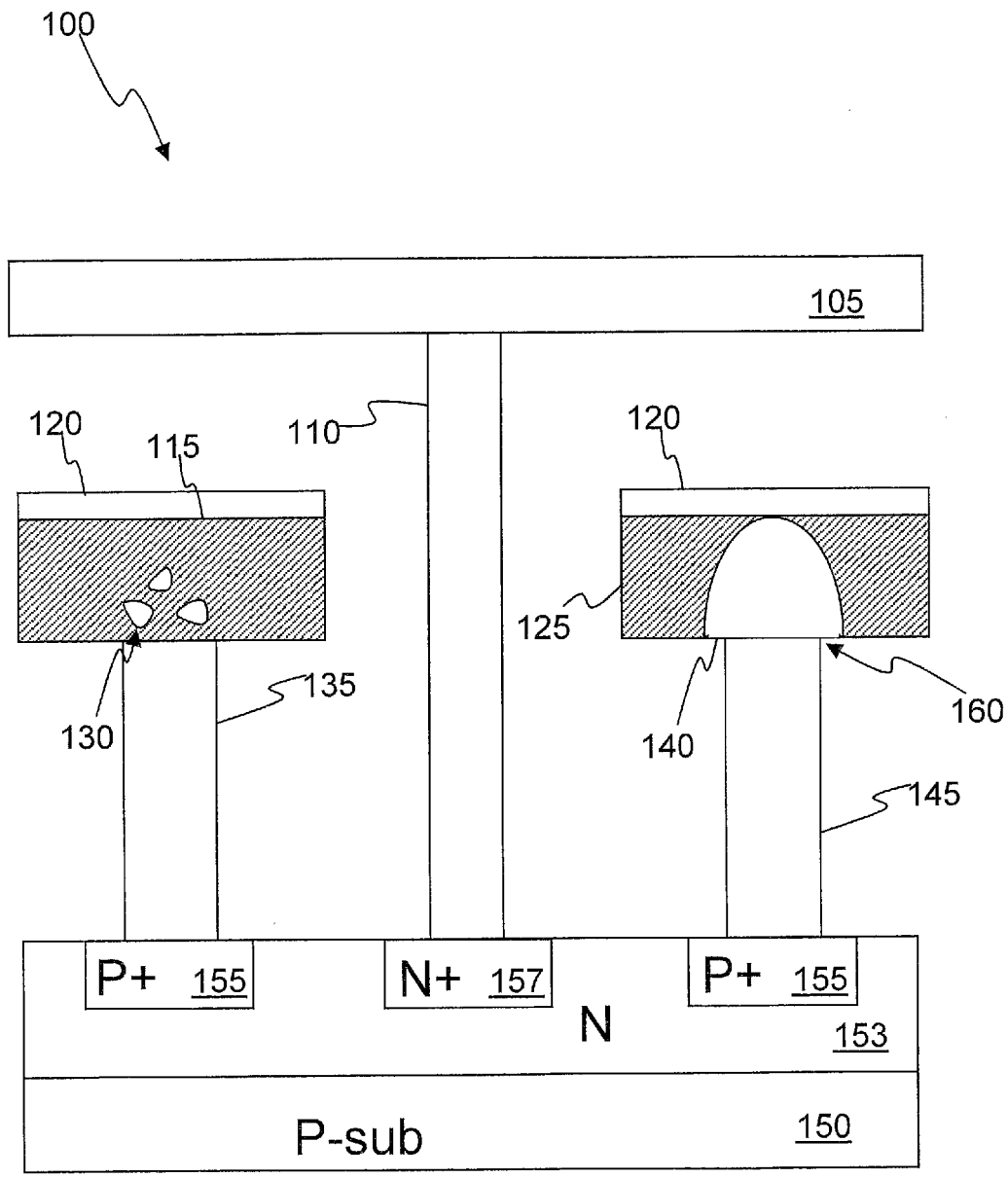
FIG. 1 is a schematic diagram of a portion of phase change memory, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture involving a ramping-down bias signal or set pulse to crystallize an active volume of phase change material in a phase change memory (PCM) cell during a setting phase of memory operation. Such a setting phase may result from a write command directed to the PCM in order to write and store a bit of information. For example, such a bias signal may be applied to a PCM cell during read and/or write operations by a memory controller, for example. Particular characteristics of a bias signal may lead to a desired set pulse in terms of crystallization and overall speed of a PCM, for example. Here, a desired set pulse may achieve a relatively fast effective crystallization of a population of PCM cells. In a particular implementation, a bias signal may comprise one or more individual set pulses applied to a PCM cell until phase change material in the PCM cell transitions to a crystalline state. In particular, subsequent set pulses may have a smaller peak amplitude than a previous set pulse. In one implementation, a series of such set pulses comprises a waveform having individual peak amplitudes that sequentially decrease from one pulse to the next. Such an implementation may address an issue of variability of physical and/or electrical characteristics of a plurality of PCM cells in a PCM or in multiple PCM devices, for example, as explained in detail below. Such a bias signal, of course, may comprise a variety of characteristic shapes and/or configurations, and claimed subject matter is not limited in this respect.

In an embodiment, a process of writing to a PCM may comprise a process to verify that a particular bit was successfully written to a memory cell of the PCM. In one implementation, a magnitude of a set or reset pulse may be sequentially increased until a particular PCM cell is determined to be successfully set or reset. In one implementation, a particular bit may comprise a "zero" or reset bit. Here, a reset pulse may be applied to a memory cell to melt and subsequently quench phase change material in the memory cell so that the phase change material has a relatively high resistance. Accordingly, a verify process may include a technique to verify that phase change material was reset to such a high resistance subsequent to application of a reset pulse. On the other hand, such a particular bit may comprise a "one" or set bit. Here, a set pulse may be applied to a memory cell to melt (though such melting need not occur) and relatively slowly cool phase change material in the memory cell so that the phase change material has a relatively low resistance. Accordingly, a verify process may include a technique to verify that phase change material was set to such a low resistance subsequent to application of a set pulse.

In a particular embodiment, a verify reference current value may be used as a threshold with which a cell current during verify is compared. Such a cell current during verify may result by applying a voltage across a PCM cell so that the cell current during verify may depend, at least in part, on a resistance of the PCM cell. Accordingly, the state of a PCM cell, e.g., low resistance or high resistance, may be determined by comparing such a cell current during verify to a particular selected verify reference current value. However, if such a verify reference current value is relatively high, then PCM cells having relatively small contact area between a heater and phase change material may fail to reach this value. Further, increasing pulse amplitudes and/or pulse durations may damage a PCM cell, reduce its reliability, and/or worsen its read/write performance, for example. On the other hand, if such a verify reference current value is relatively low, then PCM cells having relatively large contact area between a heater and phase change material may be undesirably set with considerable amount of amorphous regions remaining in the PCM cell. In an implementation, such possible problems may be addressed by varying a magnitude of a verify reference current value during a process of setting a PCM cell. In particular, a series of set pulses comprising a bias signal waveform having individual peak amplitudes that sequentially decrease from one pulse to the next, as discussed above, may be associated with verify reference current values that decrease in step with the individual peak amplitudes of such a bias signal, as explained in further detail below. A series of two or more such decreasing verify reference current values may be called a descending verify cycle. In one implementation, such descending verify cycles may be repeated while a series of set pulses may be incrementally increased or decreased from one set pulse to the next, for example. Of course, such details of verify reference current values are merely examples, and claimed subject matter is not limited in this respect. In an alternate implementation, a current bias may be forced during a read process and a resulting voltage may be measured: in such a case a subsequent reference voltage to be compared against the cell current during verify may be higher than the previous one. However, in the following description, voltage bias (and comparing currents) will be used as a reference.

FIG. 1 is a diagram of a portion of phase change memory 100, according to an embodiment. Such a portion is shown to include two memory cells, each memory cell being in a different memory state for illustrative purposes. An N stripe 153 (e.g., acting as a bipolar transistor base) may be formed into a semiconductor P-type substrate 150 (e.g., a collector), which may include P+ doped regions 155 (e.g., emitters) as well as N+ doped region 157 (e.g., contact to base), though other configurations may be used. Phase change memory 100 may include word lines 105, bit lines 120, and word line contact 110. To represent one memory state, a heater 145 contacting a portion of phase change material 125 may heat to melt a portion 140 of phase change material 125, which may then be cooled relatively quickly to comprise amorphous germanium antimony telluride (GST), for example. Such an amorphous material may be relatively highly resistive, resulting in a high-resistance connection to a bitline contact 120. To represent another memory state, a heater 135 contacting a portion of phase change material 115 may heat to melt a portion of phase change material 115, which may then be cooled relatively slowly to comprise a crystalline or polycrystalline, low-resistance material. Such polycrystalline phase change material 115 may thus lead to a low-resistance connection to contact 120. In one implementation, a contact area 160 between heater 145 and phase change material 125 may vary from one memory cell to another, as explained in detail below. Of course, details of such a portion of a PCM are merely examples, and claimed subject matter is not so limited.

Polycrystalline phase change material 115 may develop one or more imperfections 130, which may comprise non-crystallized amorphous regions, resulting from performing a crystallization process too quickly and/or using an excessively large or small peak amplitude bias signal. Such imperfections 130 may detrimentally increase resistance of a connection to bitline contact 120, leading to malfunctioning of the memory cell. For example, such a failed memory cell may fail to read the binary value represented by the low-resistance state.

Figure 2:
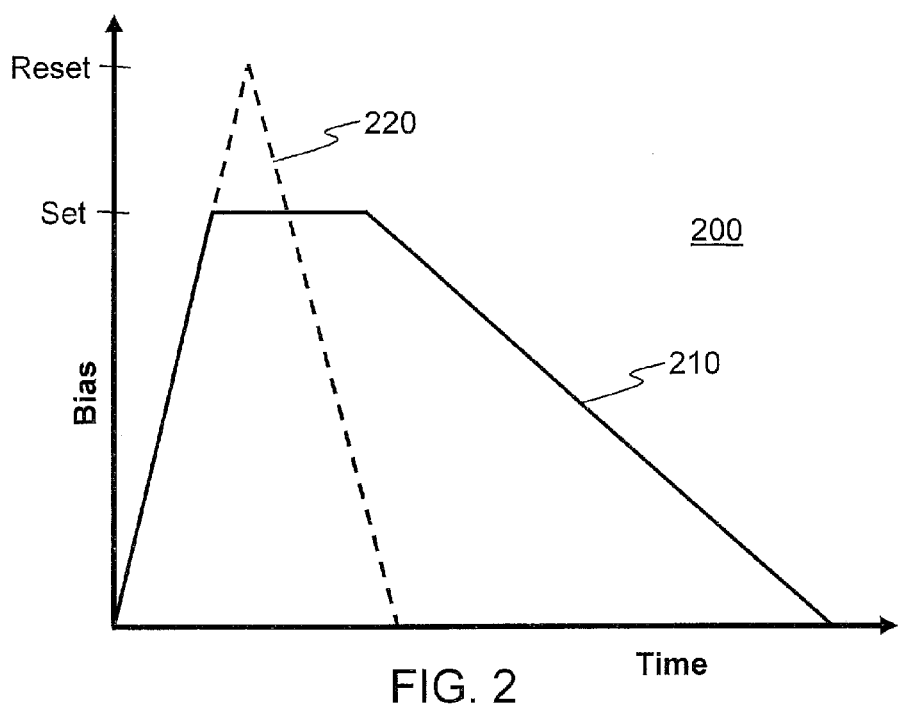
FIG. 2 is a plot of characteristics of bias signal waveforms, according to an embodiment.

FIG. 2 is a plot 200 of characteristics of bias signal waveforms, according to an embodiment. A PCM cell may be reset by melting phase change material by applying a relatively high amplitude, relatively short duration electrical programming pulse or bias signal 220. In a reset state, an active region of phase change material may comprise an amorphous region that is dome-shaped, disposed adjacent to a heater element in a PCM cell, for example. Crystallized phase change material may surround such an amorphous region. In such a state, a PCM cell may have a relatively high electrical resistance. In a subsequent process, a PCM cell may be set by crystallizing a dome-shaped amorphous region so that a substantially entire region of phase change material may be crystalline. Such a process may involve ramping down a voltage and/or current of relatively low amplitude, relatively long duration bias signal 210 applied to a PCM cell to crystallize its phase change material. In such a state, a PCM cell may have a relatively low electrical resistance. Such a process of crystallizing a dome-shaped amorphous region may be performed relatively quickly in order to benefit operational performance (e.g., speed) of the PCM cell. However, performing such crystallization too quickly may result in non-crystallized amorphous regions and/or imperfections in the phase change material, resulting in a higher-than-desired electrical resistance. In other words, such a crystallization process may involve a ramping-down bias signal that provides enough time to fully crystallize a dome-shaped amorphous region without adversely producing amorphous regions and/or imperfections. Accordingly, a process of determining setting rate for a PCM cell may involve a trade-off between PCM write speed and assuring that a high percentage of the phase change material is crystallized.

In an embodiment, a PCM may comprise a plurality of PCM cells that include a phase change material. Due to variations in fabrication conditions from lot to lot and/or from region to region on a semiconductor wafer, for example, characteristics and/or physical parameters of such PCM cells may vary. Of course, such variations may result from any of a number of situations or conditions. For another example, physical position of a PCM cell in a circuit may affect and/or modify physical parameters of a PCM cell. In particular, capacitance, magnetic and electric fields, and/or heat may contribute to such variations, though claimed subject matter is not limited in this respect. Accordingly, one portion of PCM cells in a PCM may behave differently from another portion of PCM cells.

For example, a maximum current, herein called Imax, that a substantially fully crystallized PCM cell is able to sink under a given read or verify bias condition may vary among PCM cells. Such a maximum current, which need not comprise a maximum current per se, may essentially be related to the crystalline state of the material. Also, Imax may refer to a current that, if substantially exceeded, may result in at least a partial transition from a crystalline phase to an amorphous phase of phase change material in a PCM cell. Such a transition may result from resistive heating beyond a temperature that a crystalline phase of a particular PCM cell may tolerate. Accordingly, a variation of resistance among PCM cells may lead to an associated variation of Imax among the PCM cells. As pointed out above in reference to FIG. 1, such a variation of resistance may result from a variation of a contact area 160 between heater 145 and phase change material 125 from one memory cell to another. In particular, a relatively large Imax may be associated with a relatively large contact area 160, a lower resistive bit if the material is fully crystallized, and a higher programming current (due to less resistive heater). A relatively small Imax may be associated with a relatively small contact area 160, a higher resistive bit if the material is fully crystallized, and a smaller programming current (due to more resistive heater). Even so, Imax may depend on physical and/or material parameters other than contact area 160, and claimed subject matter is not limited in this respect.

Figure 3:
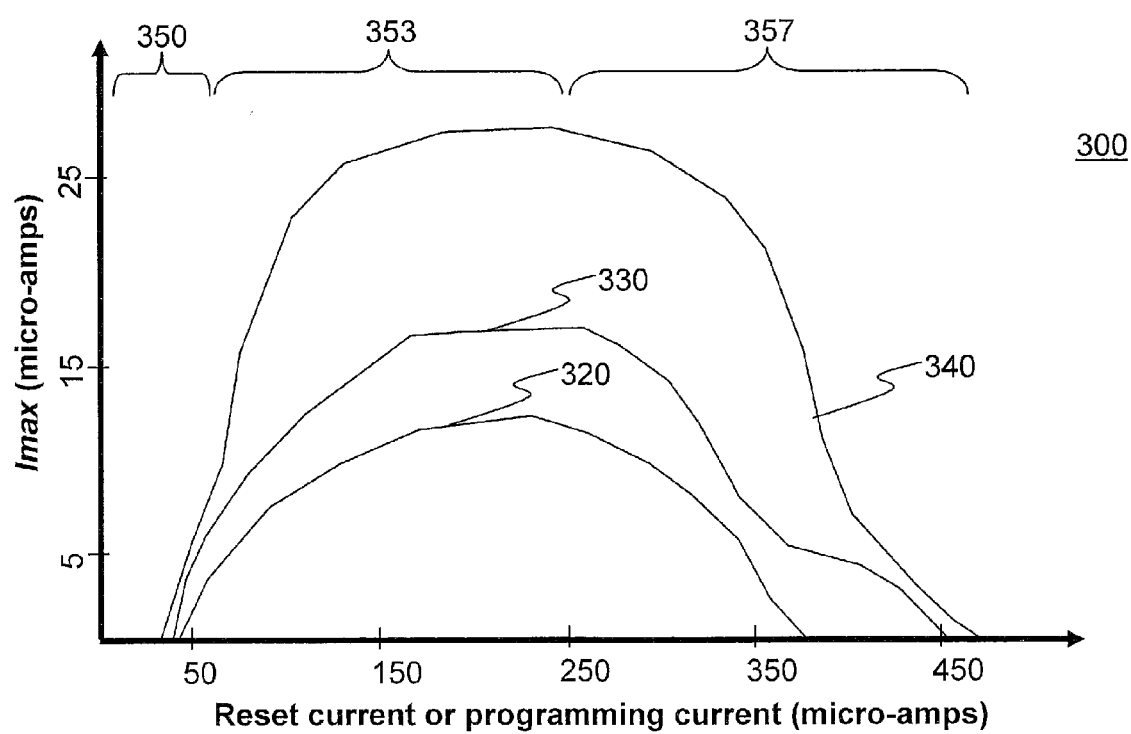
FIG. 3 is a plot showing a distribution of maximum read current versus program current for a population of memory cells in a PCM, according to an embodiment.

FIG. 3 is a plot 300 showing a distribution 300 of Imax versus reset current for a population of memory cells in a PCM, according to an embodiment. A current range 350 may correspond to a read current, a current range 353 may correspond to a set current, and a current range 357 may correspond to a reset current, for example. As discussed above, a variation of Imax among memory cells may correspond to a variation of physical and/or material parameters including contact area between a heater and phase change material, for example. In one implementation, such variations in physical and/or material parameters among PCM cells may also lead to a variation in Imax due to affects of peak current of a reset bias signal. For example, plots 320, 330, and 340, which represent different PCM memory cells, show an aspect of how Imax depends on reset current. Also, plot 300 shows that Imax may vary from one PCM cell to another. For example, plot 320 represents a memory cell that may achieve an Imax of about 13 micro-amps, whereas plot 340 represents a memory cell that may achieve an Imax of about 27 microamps. Still, plot 330 represents a memory cell that may achieve an Imax of about 17 micro-amps. Accordingly, as described above, Imax may vary from one memory cell to another. Of course, such details of PCM cell variation are merely examples, and claimed subject matter is not so limited.

As discussed above, due to variations in fabrication conditions, for example, characteristics and/or physical parameters of PCM cells in a PCM and/or from one PCM to another may vary. For example, a particular bias signal may affect some PCM cells differently from other PCM cells. Accordingly, one portion of PCM cells in a PCM may behave differently from another portion of PCM cells in response to an applied bias signal having a particular magnitude. For example, a particular magnitude of an applied set bias signal applied to one PCM cell may result in phase change material in the PCM cell being in a crystalline phase, while the same set bias signal applied to another PCM cell may result in phase change material in the PCM cell being in an amorphous phase (or a mixture of amorphous and crystalline phases), for example.

Figure 4:
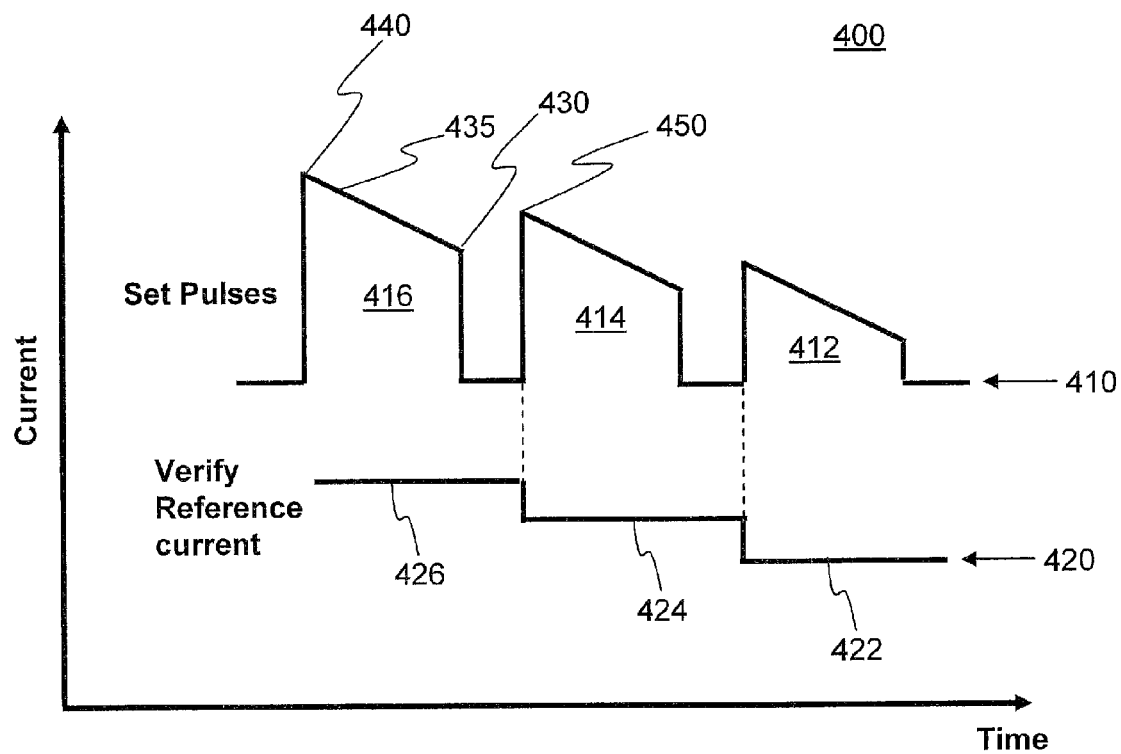
FIG. 4 is a plot of characteristics of a bias signal waveform and associated verify current values, according to an embodiment.

As mentioned above, a bias signal may comprise one or more individual set pulses applied to a PCM cell until phase change material in the PCM cell transitions to a crystalline state. In particular, subsequent set pulses may have a smaller peak amplitude than a previous set pulse. FIG. 4 is a plot 400 showing a bias signal 410, according to an embodiment. A series of set pulses 416, 414, and 412 comprises a waveform having individual peak amplitudes that sequentially decrease from one pulse to the next. Such an implementation may address an issue of variability of physical and/or electrical characteristics of a plurality of PCM cells in a PCM or in multiple PCM devices, as discussed above. In one particular implementation, first bias pulse 416 may comprise a negative-slope set ramp 435 extending from peak amplitude 440 to a ramp terminus 430. Though set pulse 416 is shown to have a linear set ramp and vertical transitions, plot 400 is only intended to represent a schematic view of bias signal, and claimed subject matter is not limited in this respect. In one particular implementation, peak amplitude 450 of second set pulse 414 may be greater than ramp terminus 430 of the previous, first set pulse 416. Accordingly, bias signal 410 may include a series of set pulses that have overlapping magnitudes, though claimed subject matter is not so limited.

Continuing with FIG. 4, a verify reference current value 420 may be used as a threshold to which a cell current during verify of a PCM cell is compared. As discussed above, such a cell current during verify may result by applying a voltage across a PCM cell so that the cell current during verify may depend, at least in part, on a resistance of the PCM cell. Accordingly, the state of a PCM cell, e.g., low resistance or high resistance, may be determined by comparing such a cell current during verify to verify reference current value 420. In an implementation, such a verify reference current value may be varied during a process of setting a PCM cell. In particular, a series of set pulses 416, 414, and 412 included in bias signal 410 may be associated with verify reference current values that decrease in step with the individual peak amplitudes of such a bias signal. For example, results of set pulse 416 applied to a memory cell may be determined using verify reference current value 426, results of set pulse 414 applied to the memory cell may be determined using verify reference current value 424, and results of set pulse 412 applied to a memory cell may be determined using verify reference current value 422, and so on. Of course, such details of verify reference current values and techniques using same are merely examples, and claimed subject matter is not limited in this respect.

Figure 5:
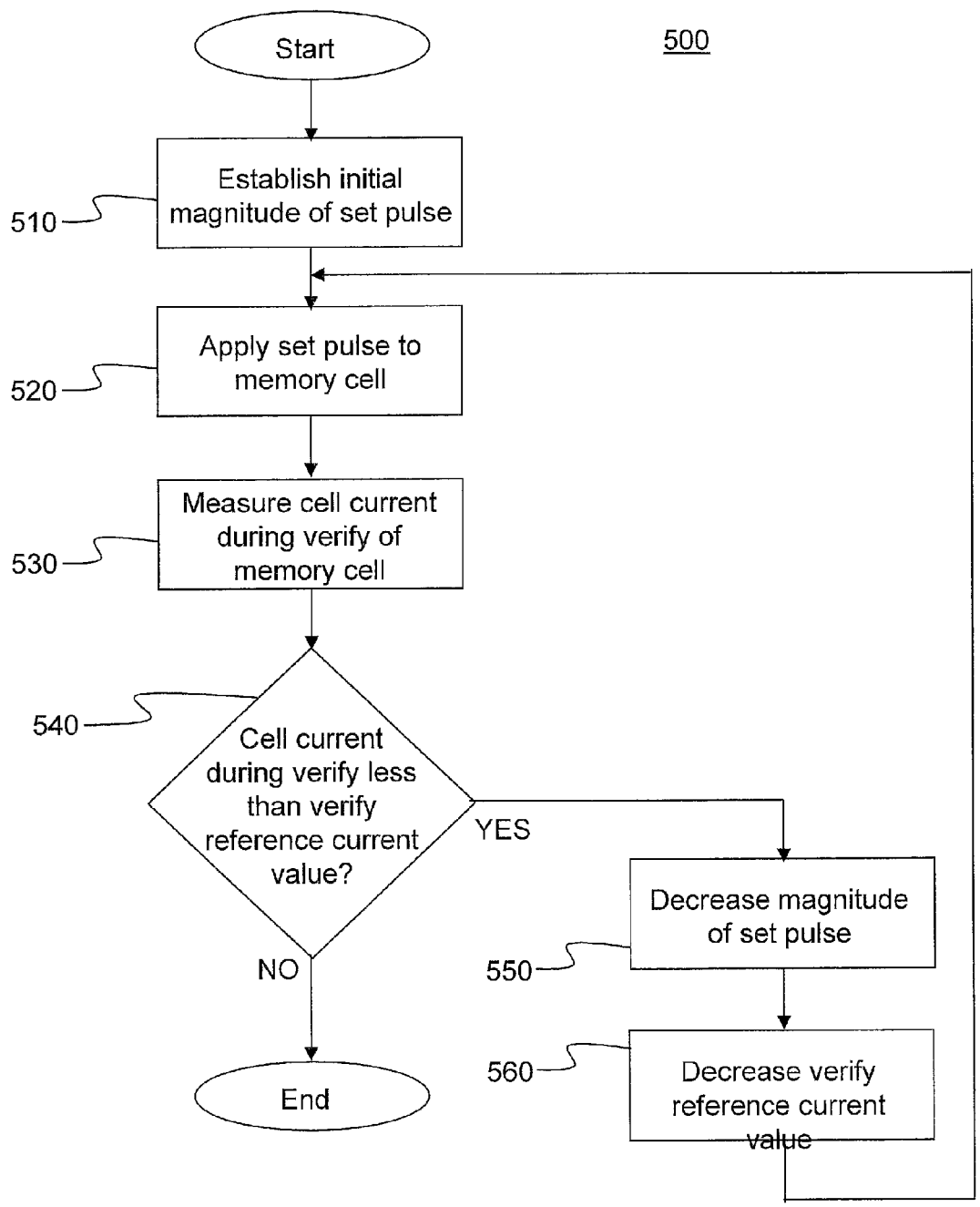
FIG. 5 is a flow diagram of a process of applying a set portion of a bias signal to a memory cell, according to an embodiment.

FIG. 5 is a flow diagram of a process 500 of applying a set portion of a bias signal to a memory cell in response to a write command, for example, according to an embodiment. Such a bias signal may be similar to bias signal 410 shown in FIG. 4, for example. Process 500 may involve a PCM comprising a plurality of PCM cells that include phase change memory. As discussed above, such a plurality of PCM cells may comprise populations of PCM cells that may respond differently to a given bias signal. Such variation in response may result from variations in fabrication conditions of the PCM cells, for example. Accordingly, one portion of PCM cells in a PCM may behave differently from another portion of PCM cells in the PCM. Process 500 may comprise a technique for setting a particular memory cell, wherein physical and/or electrical characteristics of such a particular memory cell may not be accurately known due to variations among such memory cells in a PCM. For example, as discussed above in reference to FIG. 3, a memory cell may have an Imax as low as 13 micro-amps or as high as 27 micro-amps. Such variability may be addressed by process 500 as follows.

At block 510, an initial magnitude of a set pulse may be established for a particular PCM cell or a plurality of PCM cells, for example. Such an initial magnitude may be selected by considering experimental results, trial and error, and so on of a particular sample of PCM cells and/or PCM devices. Such an initial magnitude may be about 400 micro-amps, for example, though claimed subject matter is not so limited. At block 520, a set pulse having an initial magnitude established at block 510 may be applied to a particular memory cell. Such a set pulse may be similar to a relative magnitude and/or pulse width of set pulse 416 shown in FIG. 4, for example. If the set pulse is successful, then phase change material in the memory cell may be substantially fully crystallized, resulting in a relatively low resistance. For example, PCM cells having a relatively high Imax may be successfully set, while PCM cells having a relatively low Imax may be not successfully set. Thus, success may be determined by measuring such resistance of the memory cell. A voltage may be applied across the memory cell to generate a cell current during verify, which may be measured at block 530, for example. As explained above, a cell current during verify may be compared with a verify reference current value to determine whether a memory cell exists in a set state (crystalline) or a reset state (amorphous). Such a verify reference current value may be selected by considering experimental results, trial and error, and so on of a particular sample of PCM cells and/or PCM devices. Such a verify reference current value may be about 20 micro-amps, for example, though claimed subject matter is not so limited. Accordingly, at diamond 540, a determination is made as to whether or not a cell current during verify is less than a verify reference current value. Such a verify reference current value may be similar to a relative value of verify reference current value 426, shown in FIG. 4, for example. If a cell current during verify is more than a verify reference current value, then such a result may indicate that a memory cell is successfully set, since resistance of the memory cell is sufficiently low to be in such a set state. However, if a cell current during verify is less than a verify reference current value, then such a result may indicate that a memory cell is not set, since resistance of the memory cell is relatively high. In such a case, process 500 may proceed to block 550 in preparation of a subsequent set pulse.

At block 550, the magnitude of a set pulse to be re-applied to a particular memory cell may be decreased. The amount of such a decrease may be selected by considering experimental results, trial and error, and so on of a particular sample of PCM cells and/or PCM devices. Such a decrease, or step size, may be about 50 to 100 micro-amps, for example, though claimed subject matter is not so limited. Next, at block 560, the verify reference current value to which a subsequent cell current during verify is to be compared may be decreased. An amount of such a decrease may be selected by considering experimental results, trial and error, and so on of a particular sample of PCM cells and/or PCM devices. Such a decrease, or step size, may be about 4 to 2 micro-amps, for example, though claimed subject matter is not so limited to any particular amount of decrease. Process 500 may proceed to block 520 where a second set pulse having a decreased magnitude relative to a previous set pulse may be applied to a memory cell. Such a second set pulse may be similar to a relative magnitude and/or pulse width of set pulse 414 shown in FIG. 4, for example. At block 530, a resistance of the memory cell resulting from the applied second set pulse may be determined by measuring a cell current during verify. At diamond 540, the cell current during verify may be compared to a verify reference current value that is less than the previous verify reference current value. Such a verify reference current value may be similar to a relative value of verify reference current value 424, shown in FIG. 4, for example. If the cell current during verify is more than the verify reference current value, then such a result may indicate that the memory cell is successfully set, since resistance of the memory cell is sufficiently low to be in such a set state. PCM cells having a relatively low Imax, for example, may be successfully set in response to applying such a second set pulse. However, if a cell current during verify is less than the verify reference current value, then such a result may indicate that the memory cell is not set, since resistance of the memory cell is relatively high. In such a case, process 500 may again proceed to block 550 in preparation of another subsequent set pulse.

Again at block 550, the magnitude of a set pulse to be re-applied to a particular memory cell may be further decreased. Next, at block 560, the verify reference current value to which a subsequent cell current during verify is to be compared may again be decreased. Process 500 may again proceed to block 520 where a third set pulse having a decreased magnitude relative to the previous second set pulse may be applied to the memory cell. Such a third set pulse may be similar to a relative magnitude and/or pulse width of set pulse 412 shown in FIG. 4, for example. At block 530, a resistance of the memory cell resulting from the applied third set pulse may be determined by measuring a cell current during verify. At diamond 540, the cell current during verify may be compared to a verify reference current value that is less than the previous verify reference current value. Such a verify reference current value may be similar to a relative value of verify reference current value 422, shown in FIG. 4, for example. If the cell current during verify is more than the verify reference current value, then such a result may indicate that the memory cell is successfully set. However, if the cell current during verify is less than the verify reference current value, then such a result may indicate that the memory cell is still not set. In such a case, process 500 may again proceed to block 550 in preparation of another subsequent set pulse.

In one implementation, process 500 may continue to reapply subsequent set pulses having decreasing magnitudes to a particular memory cell while using decreasing verify reference current values to determine whether or not the memory cell has been successfully set. Such an iterative process may continue until the memory cell has been successfully set. Alternatively, process 500 may cease reapplying subsequent set pulse after a particular number of such set pulses have been applied to a particular memory cell with no success in setting the memory cell. In such a case, an error message may result to indicate that the particular memory cell is damaged and/or faulty, among other possible results. Of course, such details of process 500 are merely examples, and claimed subject matter is not so limited.

In an alternative embodiment, a bias signal may comprise multiple increasing set pulses while corresponding verify reference current values may decrease. For example, a bias signal may comprise two or more set pulses having individual peak amplitudes that sequentially increase from one pulse to the next. Such a sequential increase may be linear or nonlinear, and claimed subject matter is not limited in this respect. At the end of such a series of increasing set pulses, the series may repeat, starting with the first, relatively low-peak amplitude pulse, for example. Subsequent to individual set pulses, a verify reference current value may be used as a threshold to which a cell current during verify of a PCM cell is compared. As discussed above, such a cell current during verify may result by applying a voltage across a PCM cell so that the cell current during verify may depend, at least in part, on a resistance of the PCM cell. Accordingly, the state of a PCM cell, e.g., low resistance or high resistance, may be determined by comparing such a cell current during verify to verify reference current value. Such a verify reference current value may be varied during a process of setting a PCM cell. In particular, a first series of increasing set pulses, described above, may be associated with verify reference current values that decrease in step with the individual peak amplitudes of such a bias signal. In one implementation, a first series of increasing set pulses may be associated with a first verify reference current value, a second series of increasing set pulses may be associated with a second, lower verify reference current value, a third series of increasing set pulses may be associated with a third, lower verify reference current value, and so on, for example. In other implementations, verify reference current values may be decreased corresponding to a varying number of set pulses. For example, a first series of five increasing set pulses may be associated with a first verify reference current value, a second series of four increasing set pulses may be associated with a second, lower verify reference current value, a third series of three increasing set pulses may be associated with a third, lower verify reference current value, and so on. Of course, such details of verify reference current values and techniques using same are merely examples, and claimed subject matter is not limited in this respect.

Figure 6:
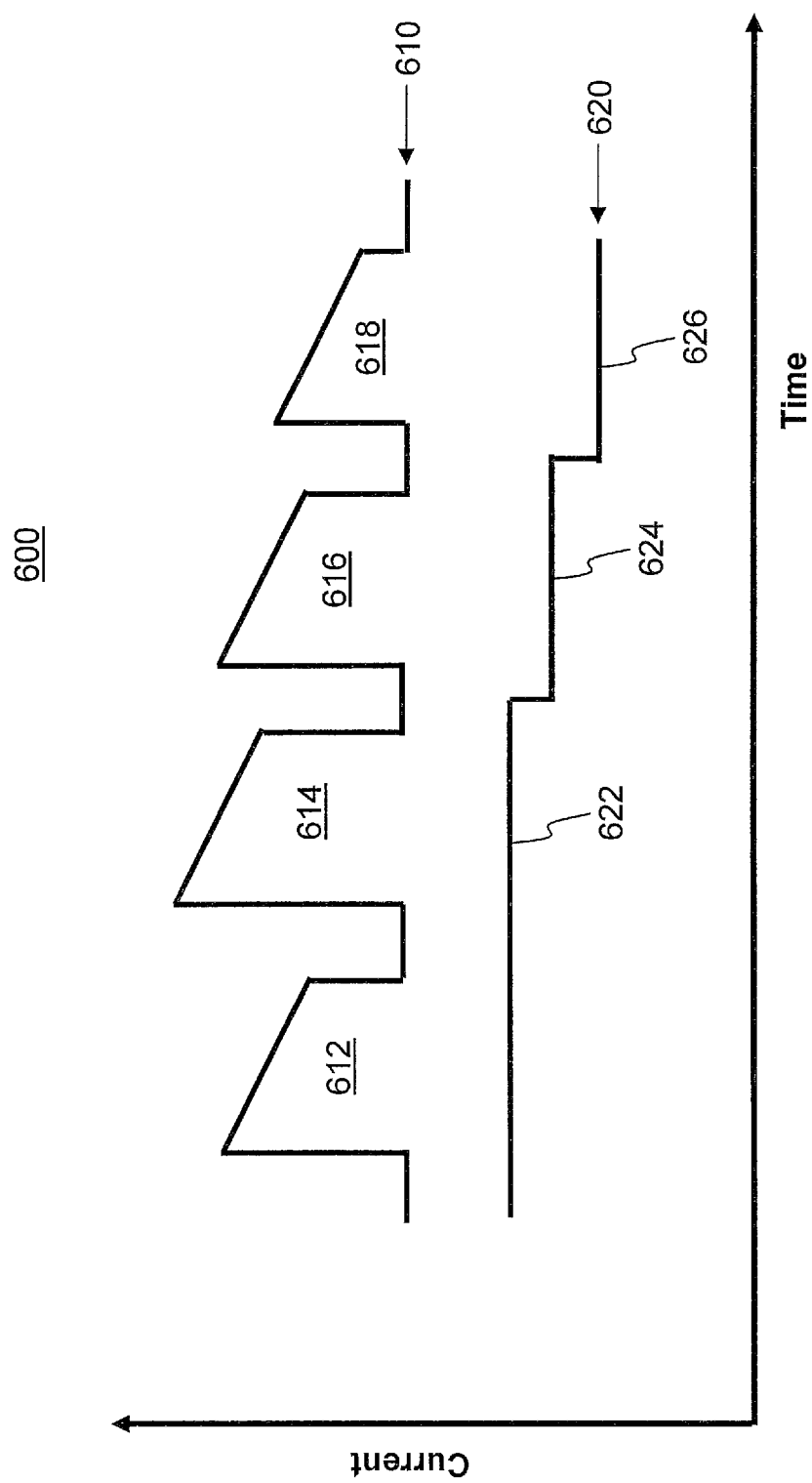
FIG. 6 is a plot of characteristics of a bias signal waveform and associated verify current values, according to an embodiment.

FIG. 6 is a plot 600 of characteristics of a bias signal waveform 610 and associated verify current values 620, according to an embodiment. Such a bias signal waveform may begin with set pulse 612 and an associated verify current value 622, for example. A subsequent set pulse 614 may have a larger peak amplitude than previous set pulse 612, though verify current value 622 may remain unchanged. However, the following set pulse 616 may have a smaller peak amplitude associated with a smaller associated verify current value 624. Next, the subsequent set pulse 618 may have yet a smaller peak amplitude than the previous set pulse 616 associated with still a smaller associated verify current value 626. Thus, descending-verify cycles may be repeated while set pulses may be incrementally increased for a first period and/or decreased for a second period. Such an embodiment may provide a benefit of avoiding over-stressing memory cells with relatively high amplitude set pulses, for example.

Figure 7:
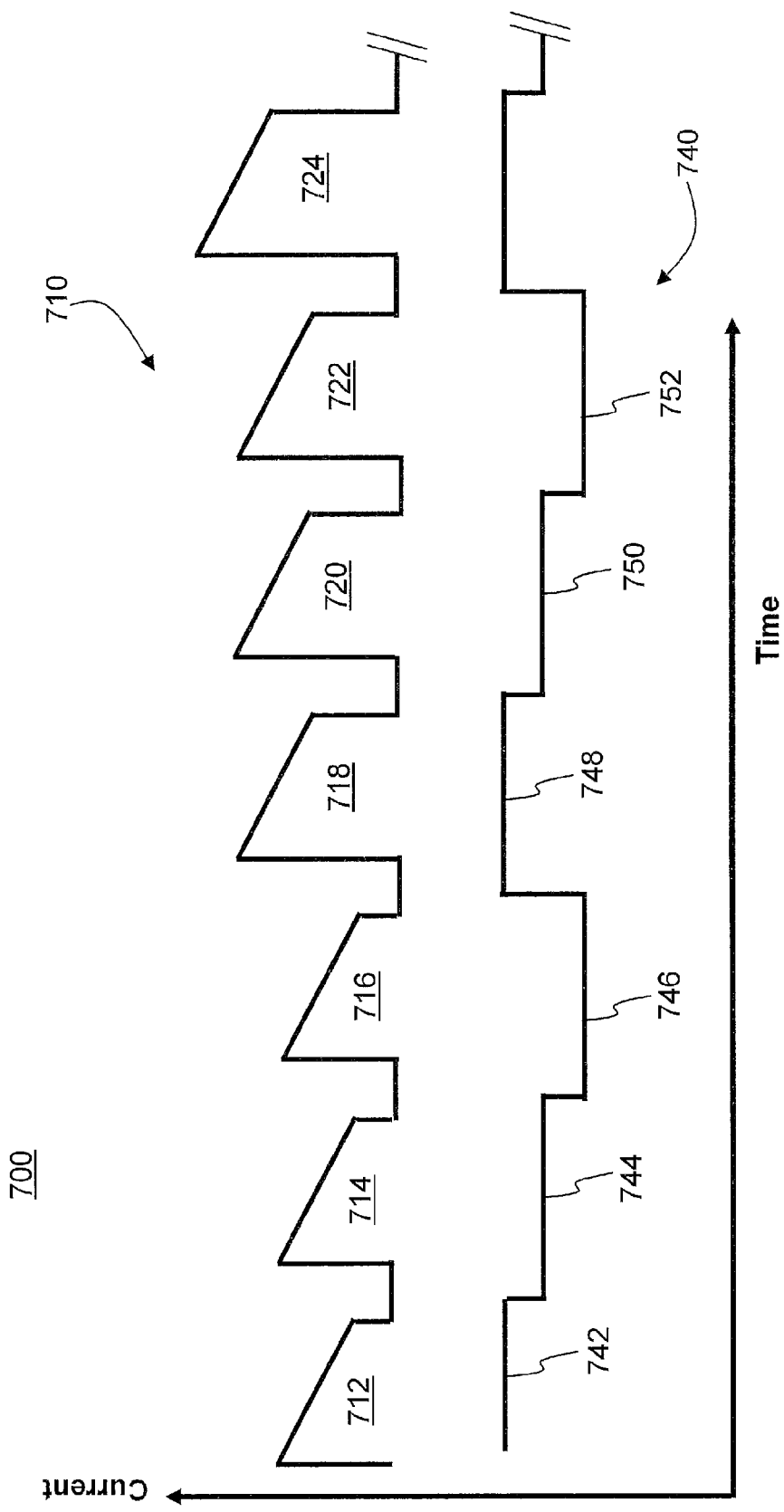
FIG. 7 is a plot of characteristics of a bias signal waveform and associated verify current values, according to another embodiment.

FIG. 7 is a plot 700 of characteristics of a bias signal waveform 710 and associated verify current values 740, according to another embodiment. Here, two or more consecutive set pulse peak amplitudes may be repeated during a descending-verify cycle. In particular, set pulses 712, 714, and 716 may have substantially similar peak amplitudes during a descending-verify cycle that includes verify current values 742, 744, and 746, respectively. Next, set pulses 718, 720, and 722 may have substantially similar peak amplitudes, which may be large than those of the previous sequence of set pulses, during a repeated descending-verify cycle that includes verify current values 748, 750, and 752, respectively. Continuing, subsequent set pulses may have increased peak amplitudes while the previous descending-verify cycle may be repeated. Of course, such details of plots 600 and 700 are merely examples, and claimed subject matter is not limited to any particular number of set pulses during any sequence, for example.

Figure 8:
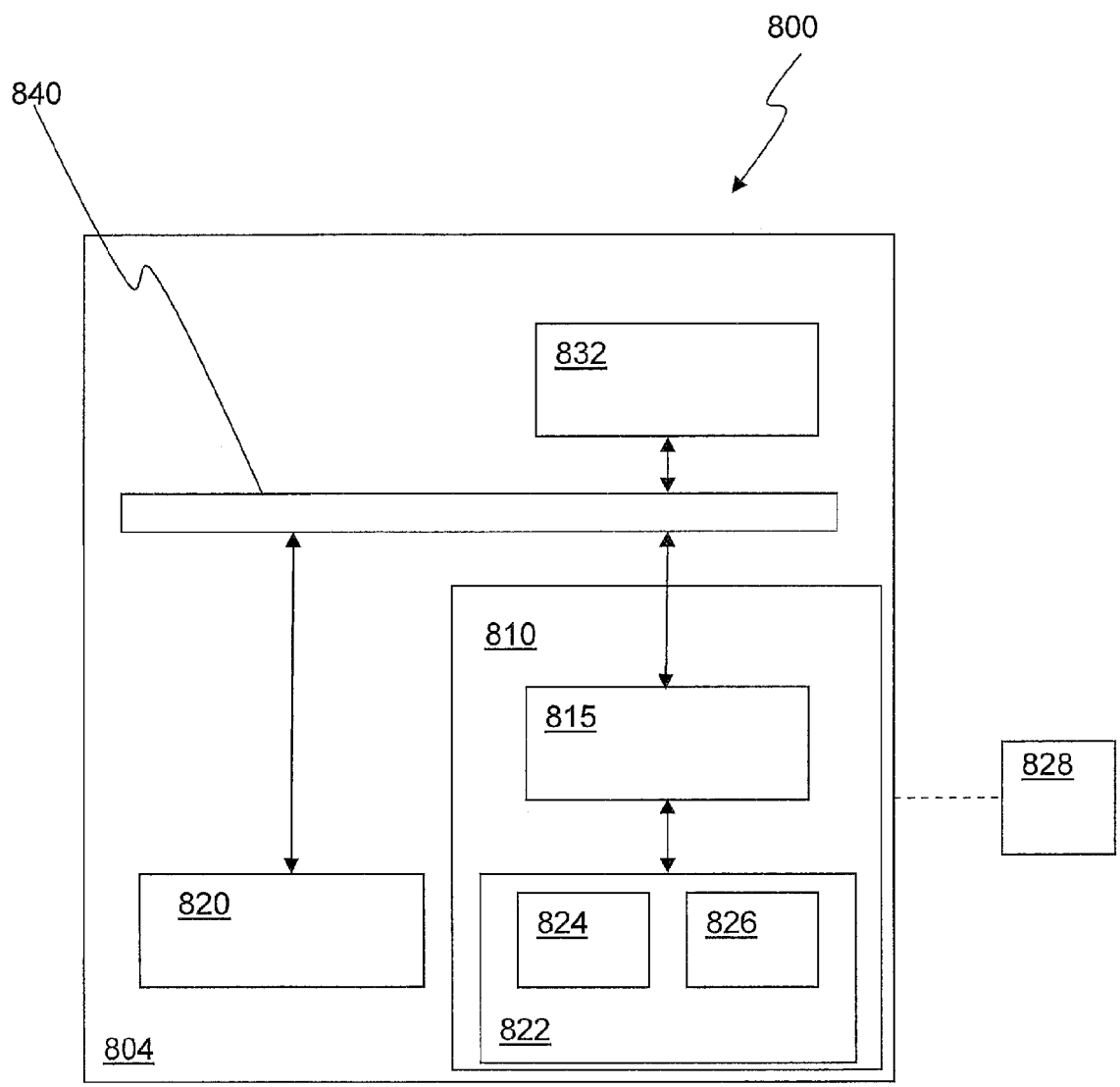
FIG. 8 is a schematic diagram illustrating an exemplary embodiment of a computing system.

FIG. 8 is a schematic diagram illustrating an exemplary embodiment of a computing system 800 including a memory device 810. Such a computing device may comprise one or more processors, for example, to execute an application and/or other code. For example, memory device 810 may comprise a memory that includes PCM 100, shown in FIG. 1. A computing device 804 may be representative of any device, appliance, or machine that may be configurable to manage memory device 810. Memory device 810 may include a memory controller 815 and a memory 822. By way of example but not limitation, computing device 804 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 800, and the processes and methods as further described herein, may be implemented using or otherwise including hardware, firmware, software, or any combination thereof. Thus, by way of example but not limitation, computing device 804 may include at least one processing unit 820 that is operatively coupled to memory 822 through a bus 840 and a host or memory controller 815. Processing unit 820 is representative of one or more circuits configurable to perform at least a portion of a data computing procedure or process. By way of example but not limitation, processing unit 820 may include one or more processors, controllers, microprocessors, microcontrollers, application specific integrated circuits, digital signal processors, programmable logic devices, field programmable gate arrays, and the like, or any combination thereof. Processing unit 820 may include an operating system configured to communicate with memory controller 815. Such an operating system may, for example, generate commands to be sent to memory controller 815 over bus 840. In one implementation, memory controller 815 may comprise an internal memory controller or an internal write state machine, wherein an external memory controller (not shown) may be external to memory device 810 and may act as an interface between the system processor and the memory itself, for example. Such commands may comprise read and/or write commands. In response to a write command, for example, memory controller 815 may provide a bias signal, such as bias signal 410 comprising a series of set pulses having individual peak amplitudes that sequentially decrease from one pulse to the next, shown in FIG. 4, for example. In particular, memory controller 815 may apply a first bias pulse to a PCM cell to attempt to place the PCM cell in a low-resistance state in response to a write command, measure a cell current during verify of the PCM cell, and apply a second bias pulse to the PCM cell to attempt to place the PCM cell in the low-resistance state, wherein the second bias pulse may include a peak amplitude that is less than that of the first bias pulse in response to a comparison of the cell current during verify with a first verify reference current value.

Memory 822 is representative of any data storage mechanism. Memory 822 may include, for example, a primary memory 824 and/or a secondary memory 826. Memory 822 may comprise PCM, for example. Primary memory 824 may include, for example, a random access memory, read only memory, etc. While illustrated in this example as being separate from processing unit 820, it should be understood that all or part of primary memory 824 may be provided within or otherwise co-located/coupled with processing unit 820.

Secondary memory 826 may include, for example, the same or similar type of memory as primary memory and/or one or more data storage devices or systems, such as, for example, a disk drive, an optical disc drive, a tape drive, a solid state memory drive, etc. In certain implementations, secondary memory 826 may be operatively receptive of, or otherwise configurable to couple to, a computer-readable medium 828. Computer-readable medium 828 may include, for example, any medium that can carry and/or make accessible data, code, and/or instructions for one or more of the devices in system 800.

Computing device 804 may include, for example, an input/output 832. Input/output 832 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 832 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
    applying a first bias pulse to a phase change memory (PCM) cell to place said PCM cell in a low-resistance state in response to a write command and in response to a comparison of a first measurement of current in said cell during verify with a first verify reference current value; and
    applying a second bias pulse to said PCM cell to place said PCM cell in said low-resistance state in response to a comparison of a second measurement of said current in said cell during verify with a second verify reference current value, wherein said second verify reference current value is less than said first verify reference current value.

2. The method of claim 1, wherein said second bias pulse includes a peak amplitude that is less than that of said first bias pulse.

3. The method of claim 1, wherein said second bias pulse includes a peak amplitude that is greater than that of said first bias pulse.

4. The method of claim 3, further comprising:
    applying a third bias pulse to said PCM cell to place said PCM cell in said low-resistance state, wherein said third bias pulse includes a peak amplitude that is less than that of said second bias pulse in response to a comparison of a third measurement of said current in said cell during verify with a third verify reference current value, wherein said third verify reference current value is less than said second verify reference current value.

5. The method of claim 1, wherein said first bias pulse comprises a set ramp from said peak amplitude to a ramp terminus, and wherein said peak amplitude of said second bias pulse is greater than said ramp terminus of said first bias pulse.

6. The method of claim 1, wherein said second bias pulse is applied to said PCM cell in response to said cell current during verify being less than said first verify reference current value.

7. The method of claim 1, wherein said PCM cell in said low-resistance state comprises a phase change material in a crystalline state.

8. The method of claim 1, further comprising repeating a descending-verify cycle while increasing peak amplitudes of said first and second bias pulses.

9. The method of claim 1, wherein said PCM comprises a chalcogenide alloy.

10. An apparatus comprising:
    a controller to:
        apply a first bias pulse to a phase change memory (PCM) cell to place said PCM cell in a low-resistance state in response to a write command and in response to a comparison of a first measurement of current in said cell during verify with a first verify reference current value; and
        apply a second bias pulse to said PCM cell to place said PCM cell in said low-resistance state in response to a comparison of a second measurement of said current in said cell during verify with a second verify reference current value, wherein said second verify reference current value is less than said first verify reference current value.

11. The non-volatile memory device of claim 10, wherein said second bias pulse includes a peak amplitude that is less than that of said first bias pulse.

12. The apparatus of claim 10, wherein said second bias pulse includes a peak amplitude that is greater than that of said first bias pulse.

13. The apparatus of claim 12, said controller to apply a third bias pulse to said PCM cell to place said PCM cell in said low-resistance state, wherein said third bias pulse includes a peak amplitude that is less than that of said second bias pulse in response to a comparison of a third measurement of said current in said cell during verify with a third verify reference current value, wherein said third verify reference current value is less than said second verify reference current value.

14. The apparatus of claim 10, wherein said first bias pulse comprises a set ramp from said peak amplitude to a ramp terminus, and wherein said peak amplitude of said second bias pulse is greater than said ramp terminus of said first bias pulse.

15. The apparatus of claim 10, wherein said second bias pulse is applied to said PCM cell in response to said cell current during verify being less than said first verify reference current value.

16. The apparatus of claim 10, said controller to repeat a descending-verify cycle while increasing peak amplitudes of said first and second bias pulses.

17. A system comprising:
    a memory device comprising an array of phase change memory (PCM) cells comprising a phase change material, said memory device further comprising a memory controller to:
        apply a first bias pulse to one of said PCM cells to place one of said PCM cells in a low-resistance state in response to a write command and in response to a comparison of a first measurement of current in said cell during verify with a first verify reference current value; and
        apply a second bias pulse to said one of said PCM cells to place said one of said PCM cells in said low-resistance state in response to a comparison of a second measurement of said current in said cell during verify with a second verify reference current value, wherein said second verify reference current value is less than said first verify reference current value; and
    a processor to host one or more applications and to initiate said write command to said memory controller to provide access to said memory cells in said memory cell array.

18. The system of claim 17, wherein said second bias pulse includes a peak amplitude that is less than that of said first bias pulse.

19. The system of claim 17, wherein said second bias pulse includes a peak amplitude that is greater than that of said first bias pulse.

20. The system of claim 19, said memory controller to apply a third bias pulse to said one of said PCM cells to place said one of said PCM cells in said low-resistance state, wherein said third bias pulse includes a peak amplitude that is less than that of said second bias pulse in response to a comparison of a third measurement of said current in said cell during verify with a third verify reference current value, wherein said third verify reference current value is less than said second verify reference current value.

21. A method comprising:
applying a first series of bias pulses to a phase change memory (PCM) cell to place said PCM cell in a low-resistance state in response to a write command and in response to a comparison of a first series of measurements of current in said cell during verify with a first verify reference current value;
applying a second series of bias pulses to said PCM cell to place said PCM cell in said low-resistance state in response to a comparison of a second series of measurements of said current in said cell during verify with a second verify reference current value, wherein said second verify reference current value is less than said first verify reference current value; and
applying a third series of bias pulses to said PCM cell to place said PCM cell in said low-resistance state in response to a comparison of a third series of measurements of said current in said cell during verify with a third verify reference current value, wherein said third verify reference current value is less than said second verify reference current value.

22. The method of claim 21, wherein said first, second, and third series of bias pulses comprises three bias pulses.

* * * * *